United States Patent
Kondoh et al.

(10) Patent No.: US 7,942,622 B2
(45) Date of Patent: May 17, 2011

(54) TRANSFER/ALIGNMENT METHOD IN VACUUM PROCESSING APPARATUS, VACUUM PROCESSING APPARATUS AND COMPUTER STORAGE MEDIUM

(75) Inventors: Keisuke Kondoh, Nirasaki (JP); Hiroshi Koizumi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 351 days.

(21) Appl. No.: 12/094,783

(22) PCT Filed: Mar. 12, 2007

(86) PCT No.: PCT/JP2007/054837
§ 371 (c)(1),
(2), (4) Date: May 23, 2008

(87) PCT Pub. No.: WO2007/108349
PCT Pub. Date: Sep. 27, 2007

(65) Prior Publication Data
US 2008/0304952 A1 Dec. 11, 2008

(30) Foreign Application Priority Data
Mar. 20, 2006 (JP) .................................. 2006-076190

(51) Int. Cl.
*H01L 21/68* (2006.01)
(52) U.S. Cl. ........................................ 414/805; 414/217
(58) Field of Classification Search .................... 901/5; 700/253–254; 318/568.13, 568.23; 702/94–95; 414/805, 217
See application file for complete search history.

(56) References Cited

U.S. PATENT DOCUMENTS

| | | | |
|---|---|---|---|
| 5,740,034 A * | 4/1998 | Saeki | 700/59 |
| 6,510,365 B1 * | 1/2003 | Nishinakayama et al. | 700/214 |
| 6,742,980 B2 * | 6/2004 | Sasaki | 414/783 |
| 6,934,606 B1 * | 8/2005 | Genetti et al. | 700/254 |
| 2004/0029300 A1 * | 2/2004 | Iijima et al. | 438/14 |
| 2005/0255609 A1 * | 11/2005 | Kumagai et al. | 438/5 |

FOREIGN PATENT DOCUMENTS

| | | |
|---|---|---|
| JP | 2004 174669 | 6/2004 |
| JP | 2004 241428 | 6/2004 |
| JP | 2004304116 A * | 10/2004 |

OTHER PUBLICATIONS

JP 2004304116 A (Nakagawa et al.) Oct. 28, 2004 (English machine translation of foreign publication). [online] [retrieved Jun. 21, 2010]. Retrieved from: http://dossier1.ipdl.inpit.go.jp/AIPN/odse_top_dn.ipdl?N0000=7400.*

* cited by examiner

*Primary Examiner* — Gregory W Adams
*Assistant Examiner* — Jonathan D Snelting
(74) *Attorney, Agent, or Firm* — Oblon, Spivak, McClelland, Maier & Neustadt, L.L.P.

(57) ABSTRACT

In a vacuum transfer chamber 10, a position detecting mechanism 33 for detecting the positions of semiconductor wafers W is arranged. The semiconductor wafers W disposed at predetermined positions in a load lock chamber 17 and vacuum processing chambers 11 to 16 are transferred to the position detecting mechanism 33 by a vacuum transfer mechanism 30 and the positions of the wafers are detected. Then, based on the detection results, aligning between the load lock chamber 17 and the vacuum processing chambers 11 to 16 is performed.

8 Claims, 10 Drawing Sheets

TRANSFER/ALIGNMENT METHOD IN VACUUM PROCESSING APPARATUS, VACUUM PROCESSING APPARATUS AND COMPUTER STORAGE MEDIUM

FIELD OF THE INVENTION

The present invention relates to a position aligning method for use in a vacuum processing apparatus performing vacuum processing on a substrate such as a semiconductor wafer, a vacuum processing apparatus and a computer storage medium.

BACKGROUND OF THE INVENTION

Conventionally, there has been used a vacuum processing apparatus for performing vacuum processing (e.g., film formation or etching) on a substrate such as a semiconductor wafer in a vacuum atmosphere. Further, there is known a so-called multi-chamber type vacuum processing apparatus, having a vacuum transfer chamber accommodating therein transfer mechanisms and a plurality of vacuum processing chambers which are provided around a periphery of the vacuum transfer chamber, for performing a vacuum processing on a substrate transferred to each of the vacuum processing chambers via the vacuum transfer chamber.

Such a vacuum processing apparatus includes at least a vacuum transfer mechanism provided in the vacuum transfer chamber and an atmospheric transfer mechanism provided in the atmospheric atmosphere. In order to increase the transfer efficiency, these transfer mechanisms are respectively provided with a plurality of picks capable of supporting a plurality of (e.g., two) substrates. Further, position alignment of these transfer mechanisms needs to be performed with respect to each of the access points.

As for such an position aligning method, there is known a method including: performing with the naked eyed rough position alignment (rough teaching) with an accuracy just enough to enable each of transfer mechanisms to transfer a substrate; transferring the substrate to each access point by a transfer mechanism; and performing precise position alignment by detecting positional displacement of the substrate by a substrate position detecting mechanism (orienter) provided in the atmospheric atmosphere (see, e.g., Patent Reference 1).

Namely, in this position aligning method, the substrate is transferred from an access point (e.g., a load lock chamber) to the orienter by the atmospheric transfer mechanism provided in the atmospheric atmosphere, so that the displacement of the substrate is detected. By correcting the displacement, the delivery position of the atmospheric transfer mechanism with respect to the access point is aligned. Next, the substrate transferred to the load lock chamber by the aligned atmospheric transfer mechanism is taken by the vacuum transfer mechanism provided in the vacuum transfer chamber, and then is transferred to, e.g., another load lock chamber adjacent thereto. Thereafter, the substrate is transferred to the orienter by the atmospheric transfer mechanism again, so that the displacement of the substrate is detected. As a consequence, the delivery position of the vacuum transfer mechanism is aligned.

In the above prior art, a delivery position of the vacuum transfer mechanism provided in the vacuum transfer chamber is aligned by the single substrate position detecting mechanism (orienter) provided in the atmospheric atmosphere. To do so, the substrate aligned by the orienter is transferred and disposed at the load lock chamber by the atmospheric transfer mechanism. Thereafter, the substrate is transferred by the vacuum transfer mechanism, and then is taken by the atmospheric transfer mechanism again. Next, the substrate is transferred to the orienter, so that the positional displacement is detected. As a consequence, a transfer distance of the substrate to the orienter becomes long and, also, errors of delivery position coordinates of the access points (load lock chambers or the like) to which the substrate are delivered are accumulated. As a result, the accuracy of the delivery position coordinates deteriorates.

Patent Reference 1: Japanese Patent Laid-open Application No. 2004-174669

SUMMARY OF THE INVENTION

To solve the above described drawbacks, the present invention provides a delivery position aligning method for use in a vacuum processing apparatus capable of improving delivery position accuracy compared to the prior art, a vacuum processing apparatus and a computer storage medium.

In accordance with a first aspect of the invention, there is provided a delivery position aligning method for use in a vacuum processing apparatus, which has a vacuum transfer mechanism, provided in a vacuum transfer chamber, for transferring a substrate in a vacuum atmosphere; a plurality of vacuum processing chambers, connected to the vacuum transfer chamber, for performing a vacuum processing on the substrate; and a load lock chamber connected to the vacuum transfer chamber, the method includes arranging in the vacuum transfer chamber a position detecting mechanism for detecting a position of the substrate; transferring the substrate disposed at a predetermined position of each of access points of the vacuum transfer mechanism to the position detecting mechanism by the vacuum transfer mechanism to detect a position of the substrate; and performing the position alignment for each of the access points by using a detection result.

In the first aspect of the invention, it is preferable that the method includes transferring the substrate disposed at a position of the vacuum transfer mechanism to the position detecting mechanism to detect a position of the substrate; and performing position alignment with respect to the position detecting mechanism by using a detection result.

In the first aspect of the invention, it is preferable that the access points include the vacuum processing chambers, and the method includes transferring the substrate disposed at a position of each of the vacuum processing chambers to the position detecting mechanism to detect a position of the substrate; and performing position alignment with respect to each of the vacuum processing chambers by using a detection result.

In the first aspect of the invention, it is preferable that the access points include the load lock chamber, and the method includes transferring the substrate disposed at a position of the load lock chamber to the position detecting mechanism to detect a position of the substrate; and performing position alignment with respect to the load lock chamber by using a detection result.

In the first aspect of the invention, it is preferable that the vacuum processing apparatus has an atmospheric transfer mechanism for transferring a substrate in an atmospheric atmosphere and an orienter for detecting a position of the substrate in the atmospheric atmosphere, and the method includes disposing the substrate at a position of the load lock chamber by using the atmospheric transfer mechanism aligned with respect to the load lock chamber by the orienter.

In the first aspect of the invention, it is preferable that the method includes transferring the substrate disposed at a position of the atmospheric transfer mechanism to the orienter to detect a position of the substrate; and performing position alignment of the atmospheric transfer mechanism with respect to the orienter by using a detection result.

In the first aspect of the invention, it is preferable that the vacuum processing apparatus has a mounting table on which a substrate accommodating case for accommodating the substrate is mounted, and the method includes transferring the substrate disposed at a position of the substrate accommodating case mounted on the mounting table to the orienter to detect a position of the substrate; and performing position alignment of the atmospheric transfer mechanism with respect to the mounting table by using a detection result.

In the first aspect of the invention, it is preferable that the method includes transferring the substrate disposed at a predetermined position of the load lock chamber to the orienter to detect a position of the substrate; and performing position alignment of the atmospheric transfer mechanism with respect to the load lock chamber by using a detection result.

In the first aspect of the invention, it is preferable that the vacuum processing apparatus has a dummy storage for disposing dummy substrates thereto, and the method includes transferring the substrate arranged in the dummy storage to the orienter to detect a position of the substrate; and performing position alignment of the atmospheric transfer mechanism with respect to the dummy storage by using a detection result.

In the first aspect of the invention, it is preferable that substrates are disposed in advance at all locations at which the substrates are allowed to be disposed, and the position alignment is performed by transferring the disposed substrates sequentially.

In accordance with a second aspect of the invention, there is provided a vacuum processing apparatus including a vacuum transfer mechanism, provided in a vacuum transfer chamber, for transferring a substrate in a vacuum atmosphere; a plurality of vacuum processing chambers, connected to the vacuum transfer chamber, for performing a vacuum processing on the substrate; a load lock chamber connected to the vacuum transfer chamber; a position detecting mechanism, provided in the vacuum transfer chamber, for detecting a position of the substrate; an atmospheric transfer mechanism for transferring the substrate in an atmospheric atmosphere; an orienter for detecting a position of the substrate in the atmospheric atmosphere; a mounting table on which a substrate accommodating case for accommodating the substrate is mounted; a dummy storage for disposing a dummy substrate; and a control unit for controlling execution of the delivery position aligning method of the first aspect of the invention.

In accordance with a third aspect of the invention, there is provided a computer storage medium for storing therein a computer executable control program, wherein the control program controls a vacuum processing apparatus to perform the delivery position aligning method of the first aspect of the invention.

DETAILED DESCRIPTION OF THE EMBODIMENTS

Figure 1:
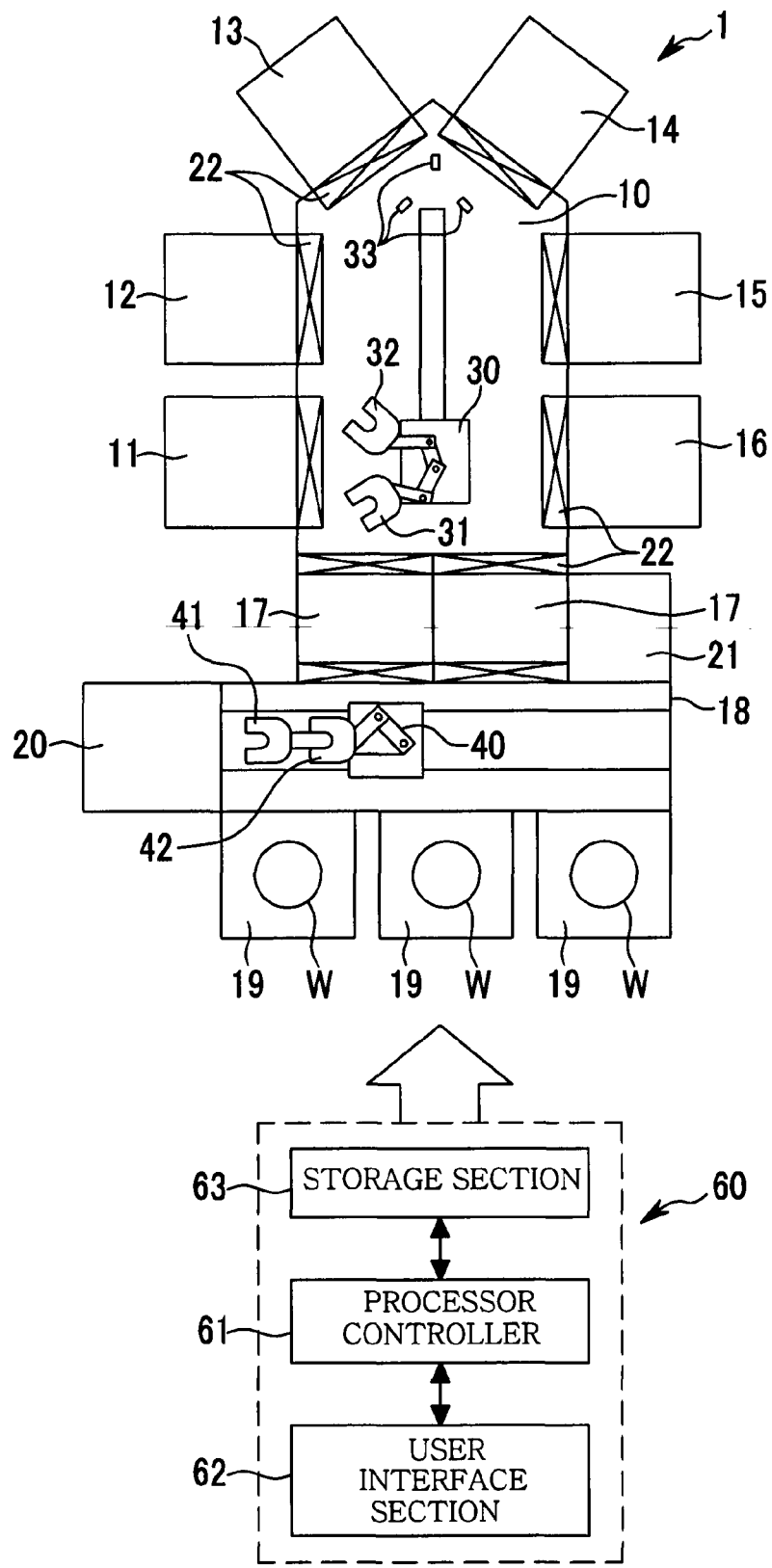
FIG. 1 illustrates an overall schematic configuration of a vacuum processing apparatus in accordance with one embodiment of the present invention.

The embodiments of the present invention will be described with reference to the accompanying drawings. FIG. 1 illustrates an overall schematic configuration of a vacuum processing apparatus 1 in accordance with one embodiment of the present invention. A vacuum transfer chamber 10 is provided at a central portion of the vacuum processing apparatus 1, and a plurality of (six in this embodiment) vacuum processing chambers 11 to 16 are arranged around a periphery of the vacuum transfer chamber 10.

Two load lock chambers 17 are disposed at a front side (lower side in FIG. 1) of the vacuum transfer chamber 10, and a transfer chamber 18 for transferring substrates (semiconductor wafers W in this embodiment) in the atmosphere is arranged at a front side (lower side in FIG. 1) of the load lock chambers 17. Provided at a front side of the transfer chamber 18 is a plurality of (three in FIG. 1) mounting tables 19 on which substrate accommodating cases (cassettes or hoops) capable of accommodating therein a plurality of semiconductor wafers W are mounted. Further, an orienter 20 for detecting positions of the semiconductor wafers W by orientation flats or notches is disposed at one lateral side (left side in FIG. 1) of the transfer chamber 18. Furthermore, a dummy storage 21 for accommodating therein dummy wafers is provided at one lateral side (right side in FIG. 1) of the load lock chambers 17.

Gate valves 22 are provided between the load lock chambers 17 and the transfer chamber 18, between the load lock chambers 17 and the vacuum transfer chamber 10, and between the vacuum transfer chamber 10 and the vacuum processing chambers 11 to 16, respectively. The gate valves serve to airtightly seal or open gaps therebetween. In addition, the vacuum transfer chamber 10 has therein a vacuum transfer mechanism 30. The vacuum transfer mechanism 30 has a first pick 31 and a second pick 32, so that two semiconductor wafers W can be supported thereon and, also, the semiconductor wafers W can be loaded into and unloaded from the vacuum processing chambers 11 to 16 and the load lock chambers 17.

Moreover, the vacuum transfer chamber 10 has therein a position detecting mechanism 33 for detecting a position of each of the semiconductor wafers W supported on the first and the second pick of the vacuum transfer mechanism 30. As for the position detecting mechanism 33, there can be used a structure for detecting positions of peripheral portions of the semiconductor wafers W by a plurality of (e.g., three) optical sensors.

Besides, the transfer chamber 18 has therein an atmospheric transfer mechanism 40. The atmospheric transfer mechanism 40 is provided with a first pick 41 and a second pick 42, so that two semiconductor wafers W can be supported thereon. The semiconductor wafers W or the dummy wafers can be loaded into and unloaded from cassettes or hoops mounted on the mounting tables 19, the lock load chambers 17, the orienter 30 and the dummy storage 21 by the atmospheric transfer mechanism 40.

An operation of the above-configured vacuum processing apparatus 1 is entirely controlled by a control unit 60. The control unit 60 includes a user interface section 62, a storage section 63 and a process controller 61 that has a CPU and controls each unit of the vacuum processing chamber 1.

The user interface section 62 has a keyboard, a display and the like. A process operator uses the keyboard when inputting commands for managing the vacuum processing apparatus 1, and the display is used to visually display the operation status of the vacuum processing apparatus 1.

The storage section 63 stores therein recipes including such as processing condition data and/or a control program (software) for implementing various processes in the vacuum processing apparatus 1 under the control of the process controller 61. If necessary, the process controller 61 executes a recipe read from the storage section 63 in response to instructions from the user interface section 62, thereby implementing a required process in the vacuum processing apparatus 1 and performing a delivery position aligning process to be described later, under the control of the process controller 61. Further, the control programs and the recipes such as the processing condition data can be read from a computer-readable storage medium (e.g., a hard disk, a CD, a flexible disk, a semiconductor memory or the like), or transmitted via on-line, e.g., a dedicated line, from another device when necessary.

The following is a description of the delivery position aligning method in the above-configured vacuum processing apparatus 1. After the assembly of the vacuum processing apparatus 1 or the like, the vacuum transfer mechanism 30 and the atmospheric transfer mechanism 40 need to be aligned with respect to their respective access points. First of all, a rough teaching is performed with the naked eye. In the rough teaching, position alignment is performed with such an accuracy that enables the semiconductor wafer W or the like to be transferred without collision with structures or the like.

Figure 2:
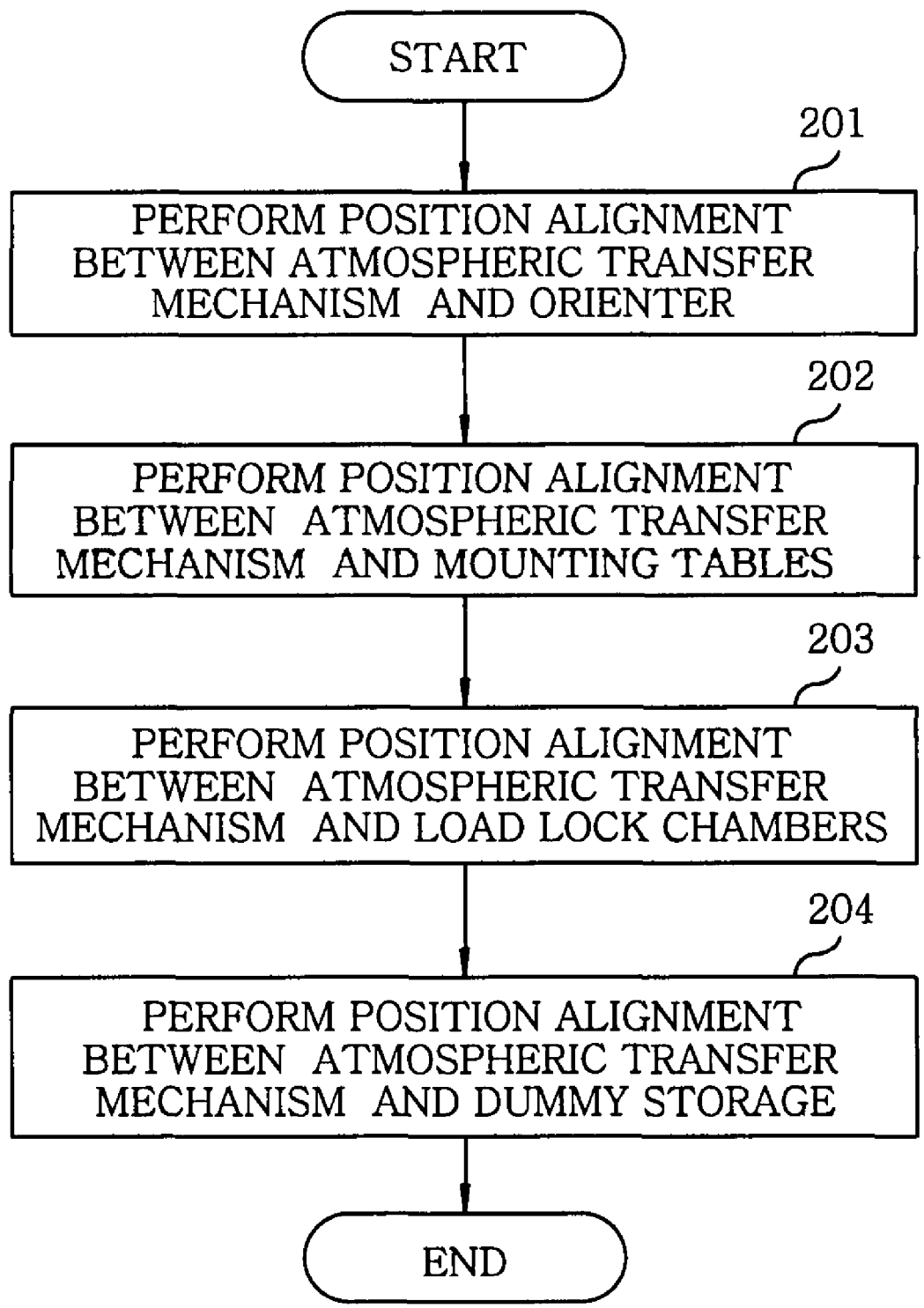
FIG. 2 presents a flow chart of a position aligning process of an atmospheric transfer mechanism in the vacuum processing apparatus of FIG. 1.

Next, high-accuracy position alignment is carried out. To begin with, position alignment of the atmospheric transfer mechanism 40 will be explained. This position alignment is performed by using the orienter 20. As illustrated in FIG. 2, first of all, position alignment between the atmospheric transfer mechanism 40 and the orienter 20 is performed (201) and, then, position alignment between the atmospheric transfer mechanism 40 and the mounting tables 19 is performed (202). Thereafter, position alignment between the atmospheric transfer mechanism 40 and the load lock chambers 17 is performed (203) and, at last, position alignment between the atmospheric transfer mechanism 40 and the dummy storage 21 is performed (204). If the position alignment between the atmospheric transfer mechanism 40 and the orienter 20 is performed firstly, the position alignments with respect to the remaining access points can be carried out in any order.

Figure 3:
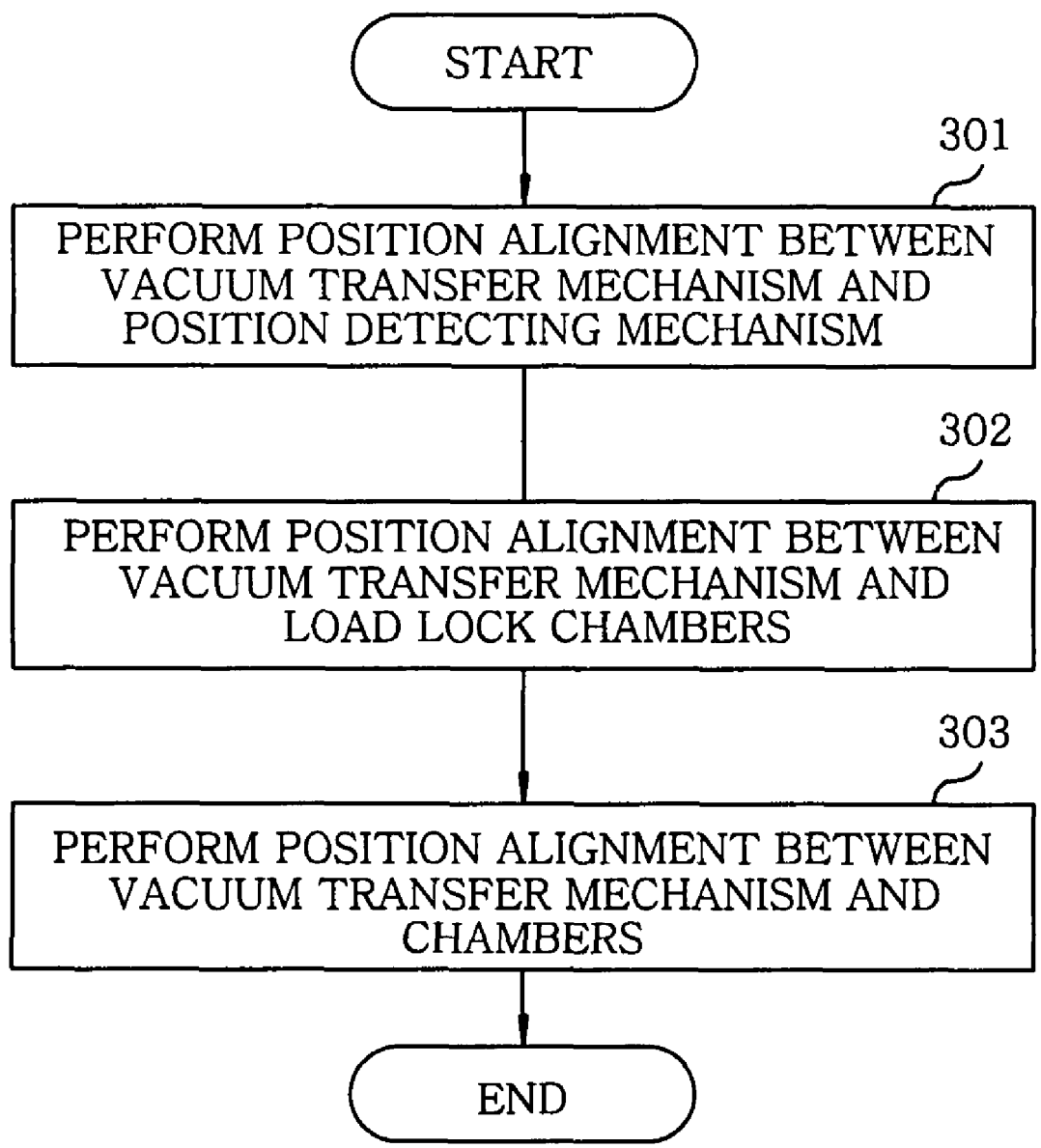
FIG. 3 represents a flow chart of a position aligning process of a vacuum transfer mechanism in the vacuum processing apparatus of FIG. 1.

In the position alignment of the vacuum transfer mechanism 30, position alignment between the vacuum transfer mechanism 30 and the position detecting mechanism 33 is performed first (301), as shown in FIG. 3. Thereafter, position alignment between the vacuum transfer mechanism 30 and the load lock chambers 17 is performed (302) and, at last, position alignment between the vacuum transfer mechanism 30 and the vacuum processing chambers 11 to 16 is performed (303). If the vacuum transfer mechanism 30 is firstly aligned with respect to the position detecting mechanism 33, either the position alignment with respect to the load lock chambers 17 or the position alignment with respect to the vacuum processing chambers 11 to 16 can be performed earlier than the other.

Figure 4:
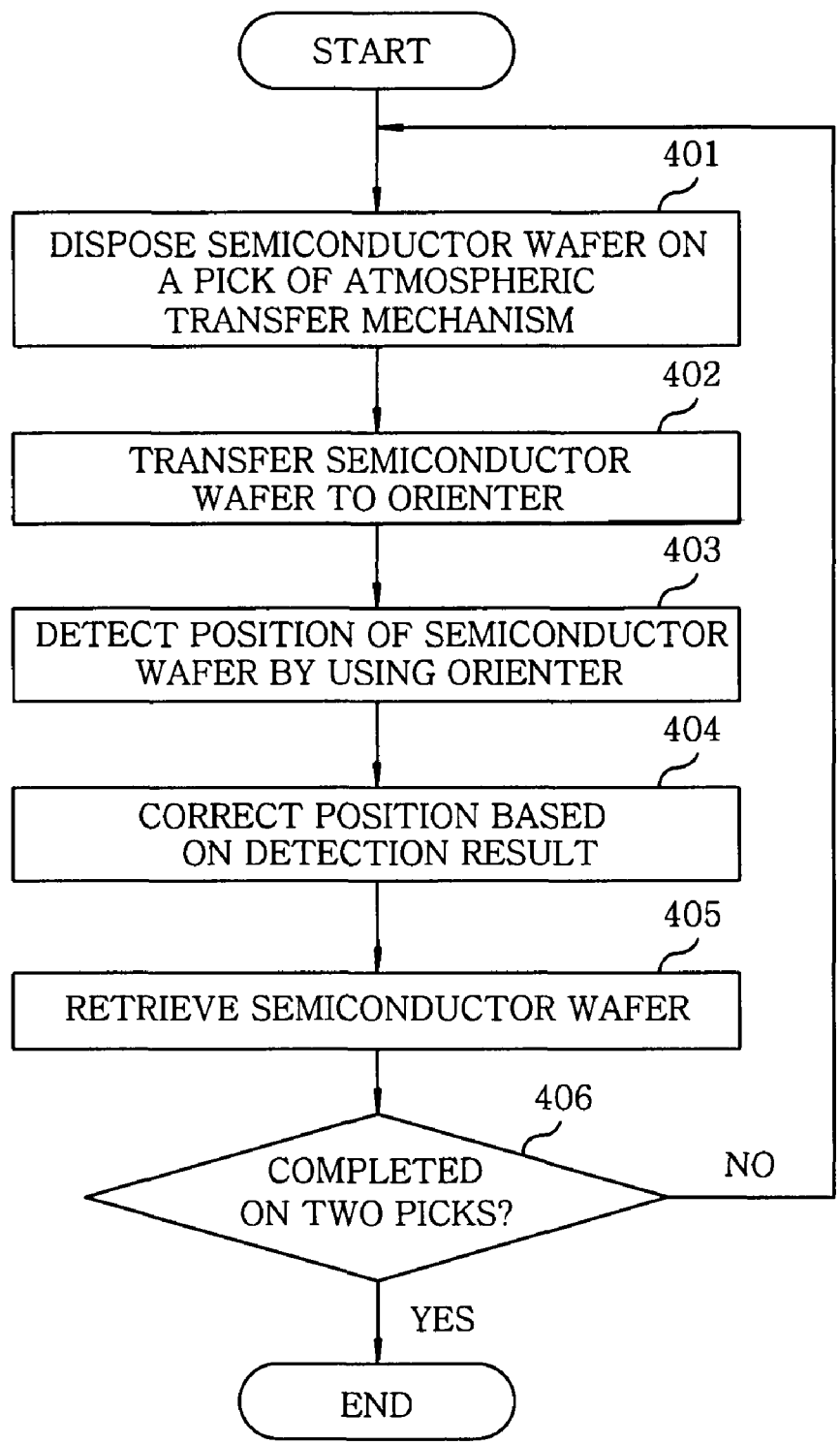
FIG. 4 is a flow chart of a position aligning process of the atmospheric transfer mechanism with respect to an orienter.

In the position alignment between the atmospheric transfer mechanism 40 and the orienter 20 which is depicted in FIG. 2, the semiconductor wafer W is disposed first at a predetermined position on the first pick 41 or the second pick 42 of the atmospheric transfer mechanism 40 (401), as illustrated in FIG. 4. Next, the semiconductor wafer W is transferred to the orienter 20 (402) and, then, a position of the semiconductor wafers W is detected by the orienter (403). The position is corrected by calculating deviation based on the detection result (404) and, thereafter, the semiconductor wafer W is retrieved (405).

The alignment performed by the above operations is carried out with respect to the two picks including the first pick 41 and the second pick 42 (406). The semiconductor wafer W is automatically retrieved to a cassette or a hoop of a predetermined mounting table 19, or manually retrieved by removing a cover of the orienter 20. This retrieving operation is applicable identically to following position aligning processes.

Figure 5:
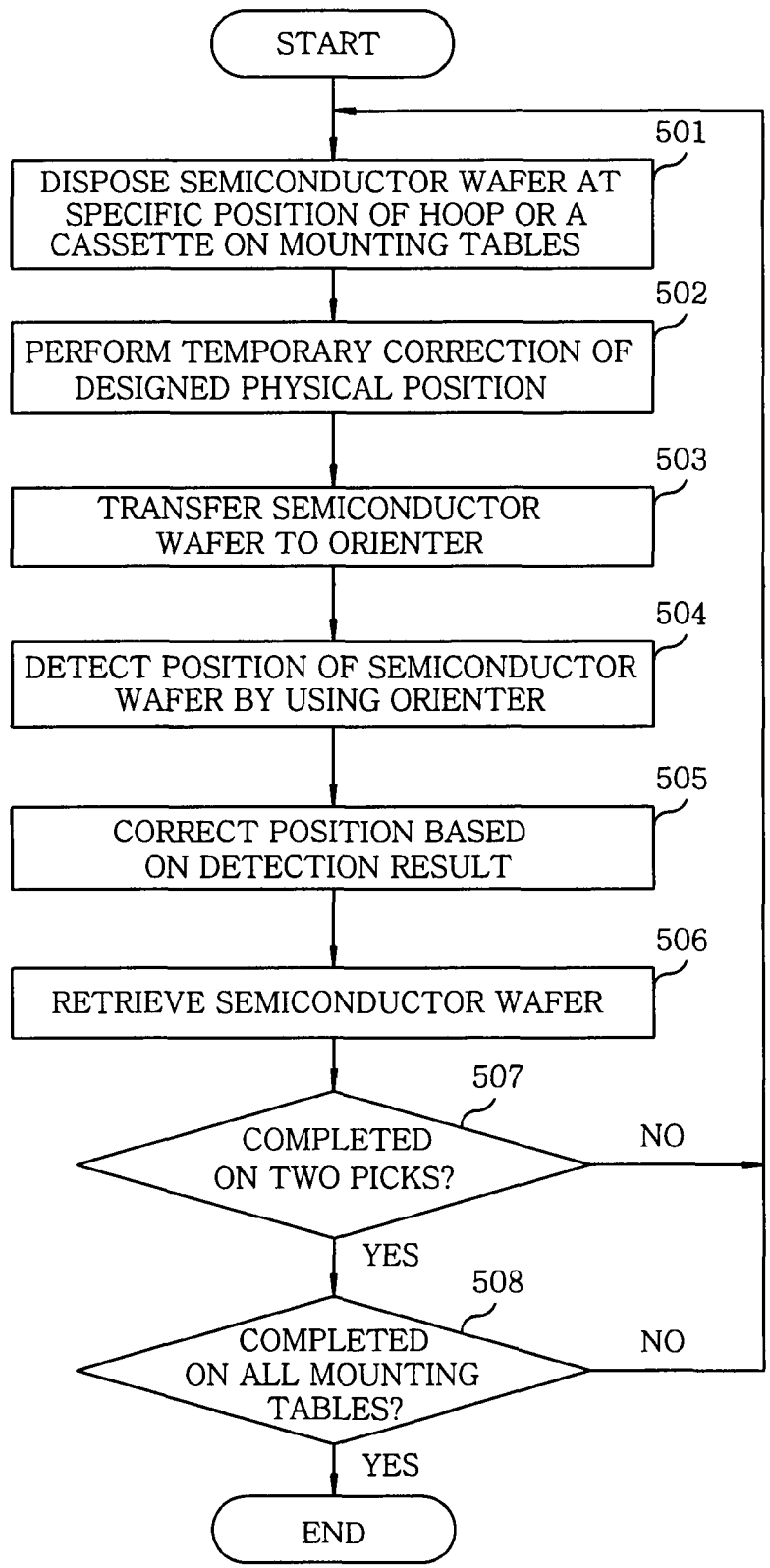
FIG. 5 offers a flow chart of a position aligning process of the atmospheric transfer mechanism with respect to mounting tables.

In the position alignment between the atmospheric transfer mechanism 40 and the mounting tables 19 which is described in FIG. 2, the semiconductor wafer W is disposed first at a predetermined position, e.g., a lowermost slot, of a cassette or hoop on the mounting tables 19 (501), as illustrated in FIG. 5. Next, a designed physical position is temporarily corrected based on position correction data of the orienter 20 (502). Thereafter, the semiconductor wafer W is transferred to the orienter 20 (503) and, then, a position of the semiconductor wafers W is detected by the orienter 20 (504). The position is corrected by calculating deviation based on the detection result (505) and, then, the semiconductor wafer W is retrieved to the original cassette or hoop (506).

The position alignment performed by the above operations is carried out with respect to the two picks including the first pick 41 and the second pick 42 (507). Further, the position alignment performed by the above operations is carried out with respect to all of the mounting tables 19 (three in this embodiment) (508).

Figure 6:
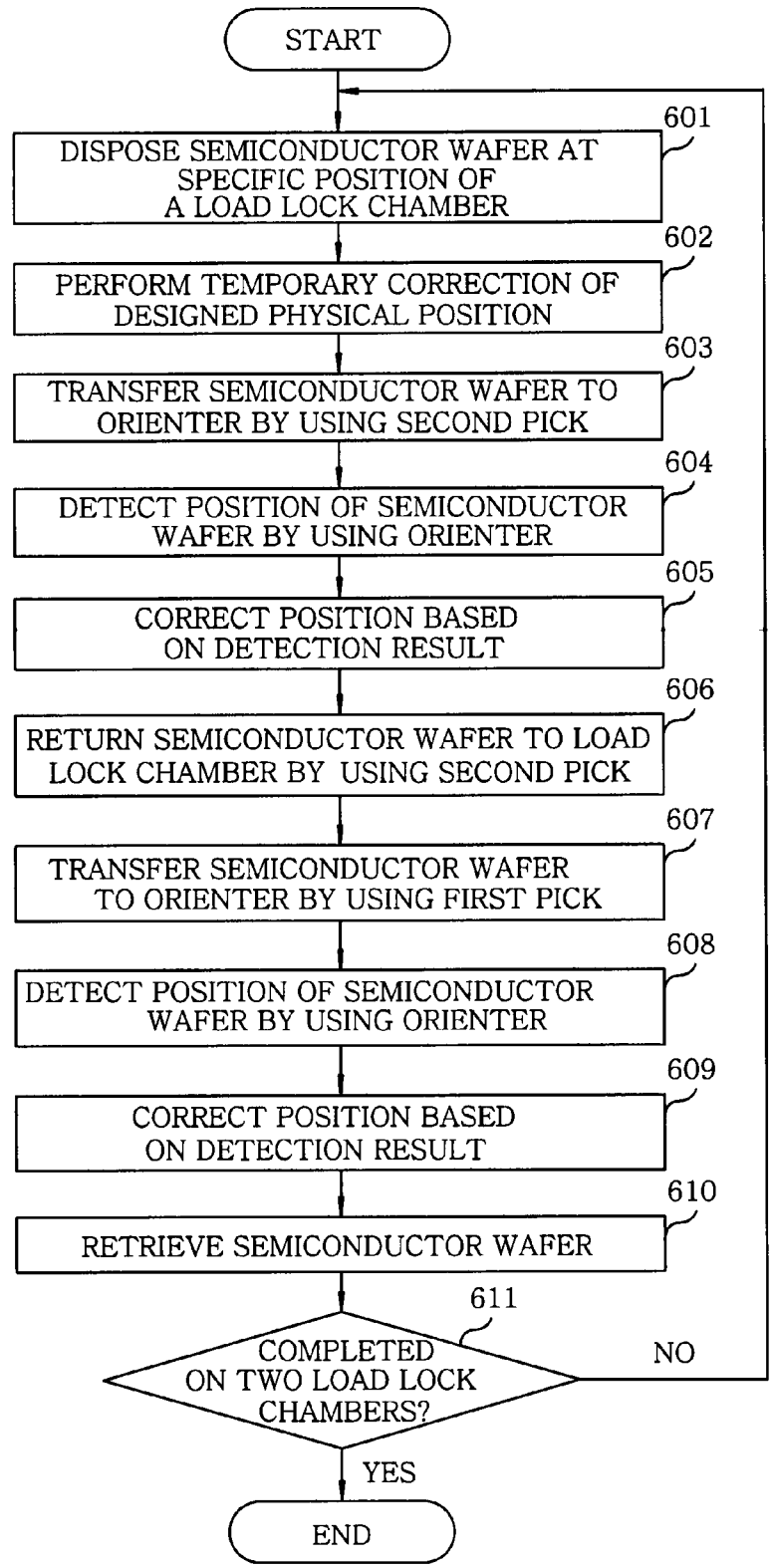
FIG. 6 depicts a flow chart of a position aligning process of the atmospheric transfer mechanism with respect to load lock chambers.

In the position alignment between the atmospheric transfer mechanism 40 and the load lock chambers 17 which is shown in FIG. 2, the semiconductor wafer W is disposed first at a predetermined position of a load lock chamber 17 (601), as shown in FIG. 6. Next, a designed physical position is temporarily corrected based on position correction data of the orienter 20 (602). Thereafter, the semiconductor wafer W is transferred to the orienter 20 by the second pick 42 (603) and, then, a position of the semiconductor wafer W is detected by the orienter 20 (604). The position is corrected by calculating deviation based on the detection result (605) and, then, the semiconductor wafer W is returned to the load lock chamber 17 by the second pick 42 (606). Next, the semiconductor wafer W is transferred to the orienter 20 by the first pick 41 (607) and, thereafter, a position of the semiconductor wafer W is detected by the orienter (608). The position is corrected by calculating deviation based on the detection result (609) and, thereafter, the semiconductor wafer W is retrieved (610).

The position alignment performed by the above operations is carried out with respect to the two load lock chambers 17 (611).

As set forth above, the position alignment with respect to the second pick 42 is performed first. This has the purpose of increasing the positioning accuracy of the second pick 42 with respect to the load lock chambers 17, because, as for the actual vacuum processing, the second pick 42 is set to be used when the semiconductor wafer W on which the vacuum processing is performed is transferred to the load lock chambers 17.

Figure 7:
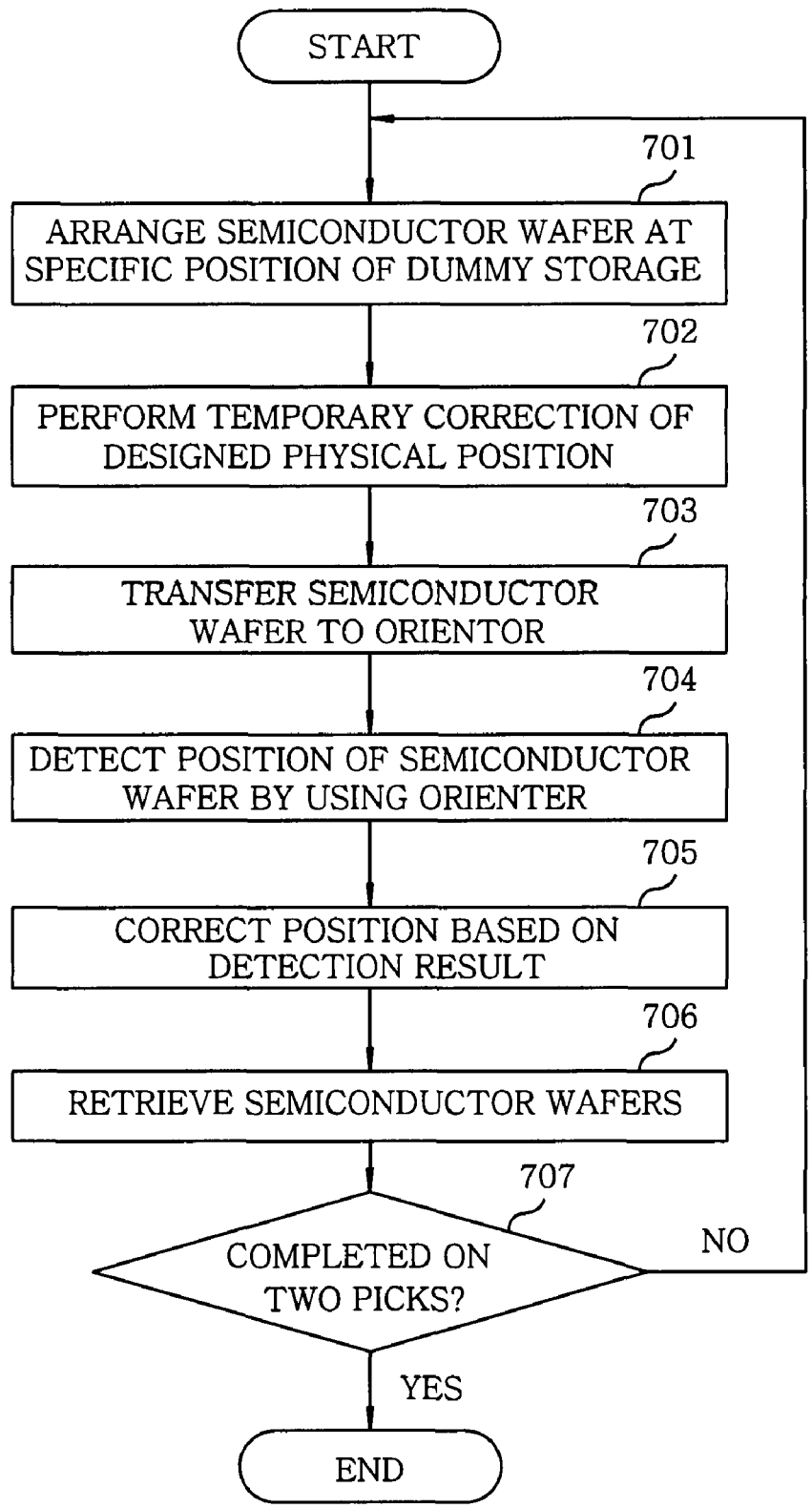
FIG. 7 sets forth a flow chart of a position aligning process of the atmospheric transfer mechanism with respect to a dummy storage.

In the position alignment between the atmospheric transfer mechanism 40 and the dummy storage 21 which is depicted in FIG. 2, the semiconductor wafer W is disposed at a predetermined position, e.g., a lowermost slot, of the dummy storage 21 (701), as illustrated in FIG. 7. Next, a designed physical position is temporarily corrected based on position correction data of the orienter 20 (702). Thereafter, the semiconductor wafer W is transferred to the orienter 20 (703) and, then, a position of the semiconductor wafer W is detected by the orienter 20 (704). The position is corrected by calculating deviation based on the detection result (705) and, then, the semiconductor wafer W is retrieved to the predetermined position, e.g., the dummy storage 21 (706). The position alignment performed by the above operations is carried out with respect to the two picks including the first pick 41 and the second pick 42 (707).

Figure 8:
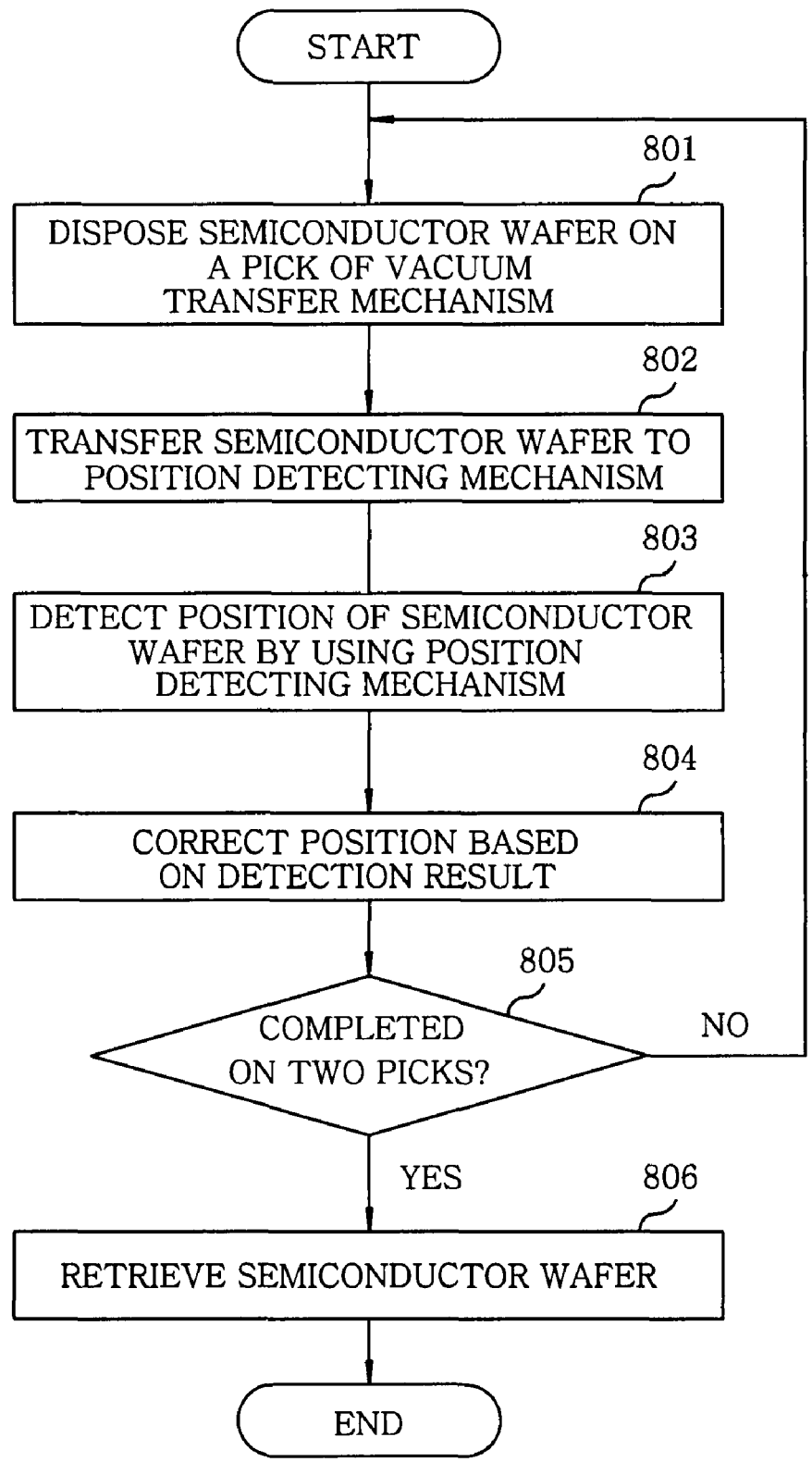
FIG. 8 provides a flow chart of a position aligning process of the vacuum transfer mechanism with respect to a position detecting mechanism.

In the position alignment between the vacuum transfer mechanism 30 and the position detecting mechanism 33 which is described in FIG. 3, the semiconductor wafer W is disposed first at a predetermined position on the first pick 31 or the second pick 32 of the vacuum transfer mechanism 30 (801), as depicted in FIG. 8. Next, the semiconductor wafer W is transferred to the position detecting mechanism 33 (802) and, then, a position of the semiconductor wafer W is detected by the position detecting mechanism 33 (803). The position is corrected by calculating deviation based on the detection result (804).

The position alignment performed by the above operations is carried out with respect to the two picks including the first pick 31 and the second pick 32 (805). Thereafter, the semiconductor wafer W is retrieved by being mounted in a load lock chambers 17 (806). In addition, the operation of disposing the semiconductor wafer W at the predetermined position on the first pick 31 and the second pick 32 of the vacuum transfer mechanism 30 is performed at the atmospheric pressure by opening the cover of the vacuum transfer chamber 10, whereas post-processes thereof are carried out in the vacuum atmosphere by closing the cover. Therefore, the operation efficiency is increased when the post-processes are performed after the semiconductor wafers W are disposed at both of the predetermined positions of the first and the second pick 31 and 32.

After the position alignment is completed, a gate valve 22 between the load lock chamber 17 and the vacuum transfer chamber 10 is closed to restore the load lock chamber 17 to the atmospheric pressure and, then, the semiconductor wafer W mounted in the load lock chamber 17 is retrieved to a predetermined location (e.g., a predetermined slot of the cassette or the hoop) by the atmospheric transfer mechanism 40.

Figure 9:
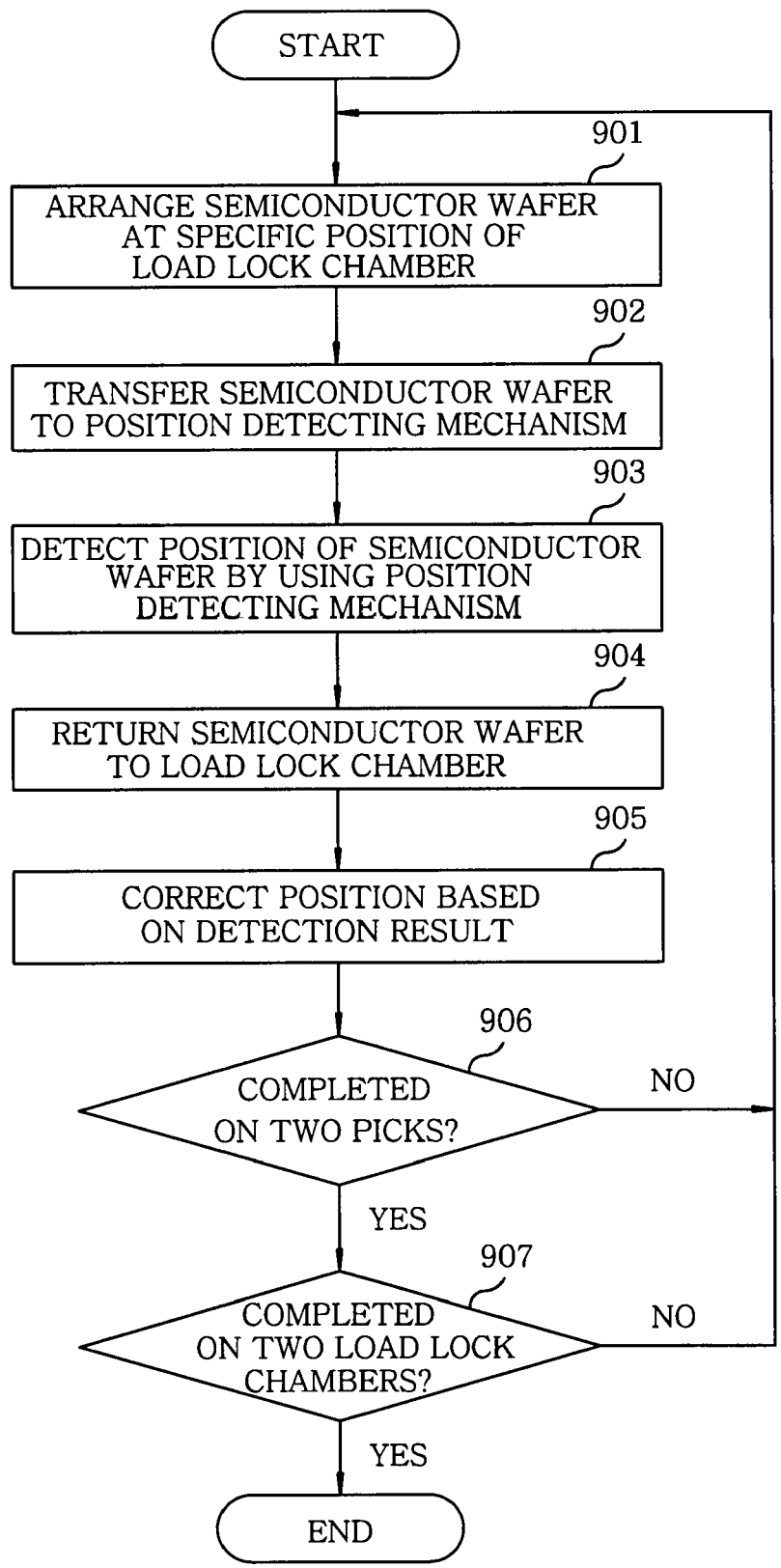
FIG. 9 describes a flow chart of a position aligning process of the vacuum transfer mechanism with respect to the load lock chambers.

In the position alignment between the vacuum transfer mechanism 30 and the load lock chambers 17 which is described in FIG. 3, the semiconductor wafer W is disposed first at a predetermined position of a load lock chamber 17 (901), as shown in FIG. 9. The disposing of the semiconductor wafer W can be performed by transferring the semiconductor wafer W, via the orienter 20, by the atmospheric transfer mechanism 40 that has been undergone the position alignment described above. Next, the semiconductor wafer W is transferred to the position detecting mechanism 33 (902) and, then, the position of the semiconductor wafer W is detected by the position detecting mechanism 33 (903). Thereafter, the semiconductor wafer W is returned to the original load lock chamber 17 (904) and, then, the position is corrected by calculating deviation based on the detection result (905).

The position alignment performed by the above operations is carried out with respect to the two picks including the first pick 31 and the second pick 32 (906). Further, the position alignment performed by the above operations is carried out with respect to each of the two load lock chambers 17 (907). Thereafter, the gate valves 22 between the load lock chambers 17 and the vacuum transfer chamber 10 are closed to restore the load lock chambers 17 to atmospheric pressure and, then, the semiconductor wafers W mounted in the load lock chambers 17 are retrieved to predetermined locations (e.g., predetermined slots of the cassettes or the hoops) by the atmospheric transfer mechanism 40.

Figure 10:
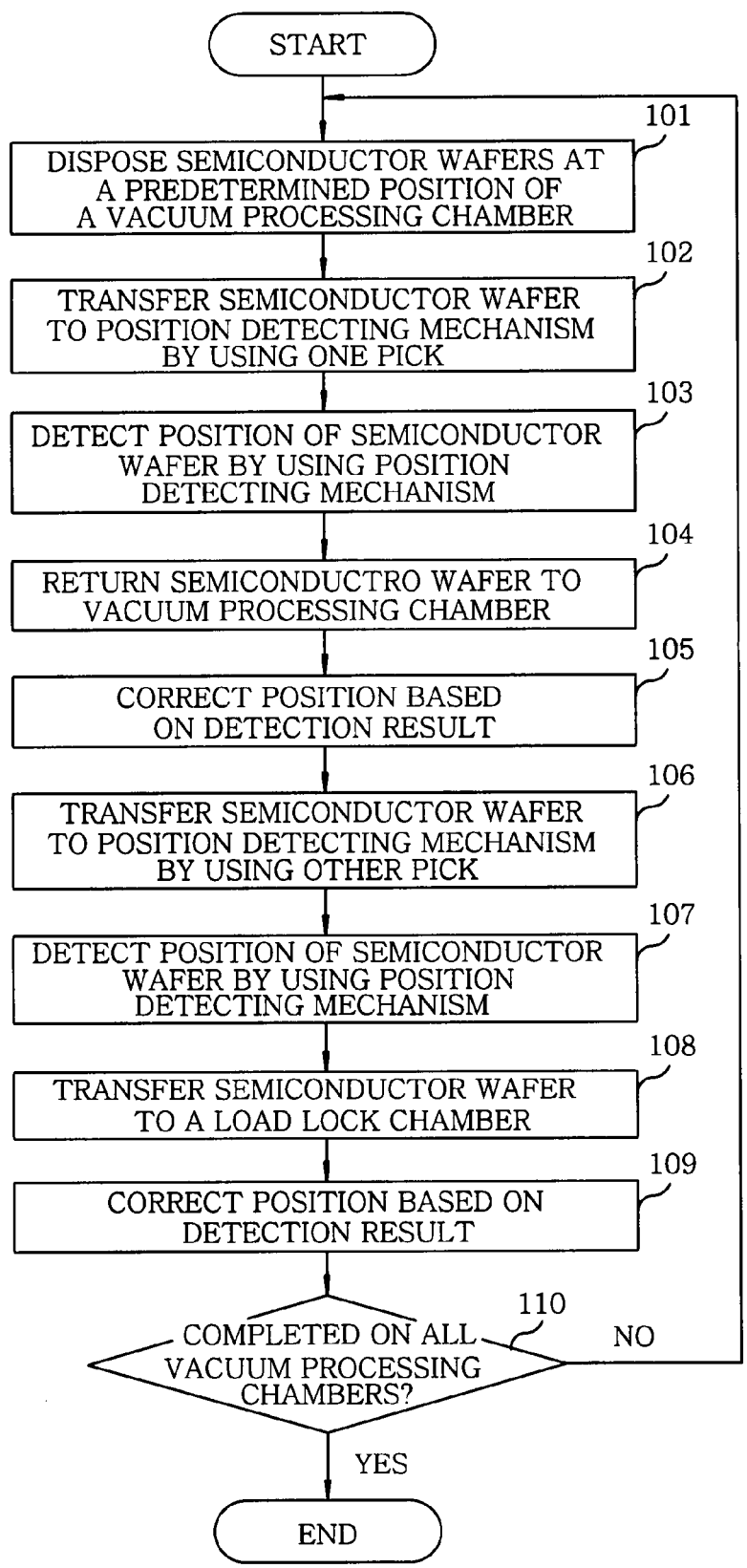
FIG. 10 shows a flow chart of a position aligning process of the vacuum transfer mechanism with respect to vacuum transfer chambers.

In the position alignment between the vacuum transfer mechanism 30 and the vacuum processing chambers 11 to 16 which is described in FIG. 3, the semiconductor wafer W is disposed first at a predetermined position of one of the vacuum processing chambers 11 to 16 by using a predetermined jig (101), as explained in FIG. 10. Next, the semiconductor wafer W is transferred to the position aligning detecting mechanism 33 by one of the picks of the vacuum transfer mechanism 30 (102) and, then, the position of the semiconductor wafer W is detected by the position detecting mechanism 33 (103). Thereafter, the semiconductor wafer W is returned to the original one of vacuum processing chamber 11 to 16 (104) and, then, the position is corrected by calculating deviation based on the detection result (105). Next, the semiconductor wafer W is transferred to the position detecting mechanism 33 by the other pick of the vacuum transfer mechanism 30 (106) and, then, the position of the semiconductor wafer W is detected by the position aligning mechanism 33 (107). Thereafter, the semiconductor wafer W is transferred to a load lock chamber 17 (108) and, then, the position is corrected by calculating deviation based on the detection result (109).

The position alignment performed by the above operations is carried out with respect to each of the vacuum processing chambers 11 to 16 (110). Further, a gate valve 22 between the load lock chamber 17 and the vacuum transfer chamber 10 is close to restore the load lock chamber 17 to atmospheric pressure and, then, the semiconductor wafer W mounted in the load lock chamber 17 is retrieved to a predetermined location (e.g., a predetermined slot of a cassette or a hoop) by the atmospheric transfer mechanism 40.

As set forth above, in this embodiment, the position alignment for each of the access points (delivery positions) in the vacuum transfer chamber 10 of the vacuum transfer mechanism 30 is performed by the position detecting mechanism 33 provided in the vacuum transfer chamber 10. Accordingly, a transfer distance of the semiconductor wafer W can be shortened compared to that of the case when the position alignment is performed by transferring the semiconductor wafer W to the orienter 20 provided at atmospheric pressure. Moreover, errors in delivery position coordinates of the access points through which the semiconductor wafer W is delivered to the atmospheric transfer mechanism 40 are not accumulated. As a result, the delivery position accuracy can be improved.

Hereinafter, a batch position aligning method (batch teaching) will be described. In this method, the semiconductor wafers W are disposed in advance at all possible predetermined positions which are needed for the above-described position alignment. Next, the atmospheric transfer mechanism 40 is aligned according to the sequence of FIG. 2, and subsequently the vacuum transfer mechanism 30 is aligned according to the sequence of FIG. 3. Accordingly, after the semiconductor wafers W are disposed at the predetermined positions, the alignment can be automatically performed without manual operations of an operator.

In the position alignment of the atmospheric transfer mechanism 40, the positions at which the semiconductor wafers W are disposed in advance include the first and the second pick 41 and 42 of the atmospheric transfer mechanism 40, the predetermined slot (e.g., the lowermost slot) of each of the cassettes or the hoops of the mounting tables 19, each of the load lock chambers 17 and the predetermined slot (e.g., the lowermost slot) of the dummy storage 21.

In the alignment of the vacuum transfer mechanism 30, the positions at which the semiconductor wafers W are disposed in advance include the first and the second pick 31 and 32 of the vacuum transfer mechanism 30, each of the load lock chambers 17 and each of the vacuum processing chambers 11 to 16. The semiconductor wafers W need to be disposed at the load lock chambers 17, to align the atmospheric transfer mechanism 40. Therefore, in order to perform the position alignment of the vacuum transfer mechanism 30, the semiconductor wafers W need to be disposed at predetermined positions of the load lock chambers 17 by the atmospheric transfer mechanism 40 that has been aligned in advance.

Moreover, in the position alignment of the vacuum transfer mechanism 30, the semiconductor wafers W that have been used for the position alignment need to be extracted from the load lock chambers 17 to the outside by the atmospheric transfer mechanism 40. Accordingly, the position alignment of the vacuum transfer mechanism 30 needs to be performed after the position alignment of the atmospheric transfer mechanism 40 is completed. However, if the vacuum transfer chamber 10 is provided with a buffer for temporarily storing semiconductor wafers W, the semiconductor wafers W that have been used for the position alignment can be stored in the buffer, so that the alignment of the atmospheric transfer mechanism 40 can be performed simultaneously with the position alignment of the vacuum transfer mechanism 30.

Hereinafter, an operation of vacuum processing in the above-configured vacuum processing apparatus 1 will be described. When the cassettes or the hoops are mounted on the mounting tables 19, the semiconductor wafers W are extracted from the cassettes or the hoops by the atmospheric transfer mechanism 40 provided in the transfer chamber 18. Then, the semiconductor wafers W are transferred to the orienter 20 so as to be aligned. Thereafter, the semiconductor wafers W are arranged in the load lock chambers 17.

Next, the semiconductor wafers W are transferred from the load lock chambers 17 to the vacuum processing chambers 11 to 16 by the vacuum transfer mechanism 30 provided in the vacuum transfer chamber 10 and, then, predetermined processes are performed thereon. Thereafter, the processed semiconductor wafers W are transferred from the vacuum processing chambers 11 to 16 to the load lock chambers 17 by the vacuum transfer mechanism 30.

Next, the processed semiconductor wafers W arranged in the load lock chambers 17 are extracted from the load lock chambers 17 by the atmospheric transfer mechanism 40, and then are accommodated in the cassettes or the hoops mounted on the mounting tables 19.

In the above vacuum processing, the semiconductor wafers W are transferred while being precisely position aligned, so that the vacuum processing can be performed with high precision. Moreover, the present invention is not limited to the above embodiments, but may be modified variously. For example, the number of mounting tables or vacuum processing chambers can be appropriately changed. The sequence of performing the position alignment can be also appropriately changed.

INDUSTRIAL APPLICABILITY

The delivery position aligning method in the vacuum processing apparatus, the vacuum processing apparatus and the computer storage medium in accordance with the present invention can be used in the field of manufacturing semiconductor devices, and thus have industrial applicability.

What is claimed is:

1. A delivery position aligning method for use in a vacuum processing apparatus, the method comprising:
    preparing the vacuum processing apparatus which has
        a vacuum transfer chamber,
        a vacuum transfer mechanism, provided in the vacuum transfer chamber, for transferring a substrate in a vacuum atmosphere,
        a plurality of vacuum processing chambers, connected to the vacuum transfer chamber, for performing a vacuum processing on the substrate,
        a load lock chamber connected to the vacuum transfer chamber,
        an atmospheric transfer chamber connected to the load lock chamber,
        an atmospheric transfer mechanism, provided in the atmospheric transfer chamber, for transferring the substrate in an atmospheric atmosphere,
        an orienter for detecting a position of the substrate in the atmospheric atmosphere, and
        a position detecting mechanism, arranged in the vacuum transfer chamber, for detecting a position of the substrate;
    aligning the atmospheric transfer mechanism and the load lock chamber by using the orienter;
    disposing the substrate at a position of the load lock chamber by using the atmospheric transfer mechanism aligned with respect to the load lock chamber by the orienter;
    transferring the substrate disposed at a predetermined position of each of access points of the vacuum transfer mechanism to the position detecting mechanism by the vacuum transfer mechanism to detect a position of the substrate, wherein the access points of the vacuum transfer mechanism include the vacuum processing chambers and the load lock chamber; and
    performing position alignment for each of the access points by using a detection result.

2. The delivery position aligning method of claim 1, further comprising:
    transferring the substrate disposed at a position of the vacuum transfer mechanism to the position detecting mechanism to detect a position of the substrate; and
    performing position alignment with respect to the position detecting mechanism by using a detection result.

3. The delivery position aligning method of claim 1, further comprising:
    transferring the substrate disposed at a position of each of the vacuum processing chambers to the position detecting mechanism to detect a position of the substrate; and performing position alignment with respect to each of the vacuum processing chambers by using a detection result.

4. The delivery position aligning method of claim 1, further comprising:
   transferring the substrate disposed at a position of the load lock chamber to the position detecting mechanism to detect a position of the substrate; and
   performing position alignment with respect to the load lock chamber by using a detection result.

5. The delivery position aligning method of claim 4, further comprising:
   transferring the substrate disposed at a position of the atmospheric transfer mechanism to the orienter to detect a position of the substrate; and
   performing position alignment of the atmospheric transfer mechanism with respect to the orienter by using a detection result.

6. The delivery position aligning method of claim 4, wherein the vacuum processing apparatus has a mounting table on which a substrate accommodating case for accommodating the substrate is mounted, the method further comprising:
   transferring the substrate disposed at a position of the substrate accommodating case mounted on the mounting table to the orienter to detect a position of the substrate; and
   performing position alignment of the atmospheric transfer mechanism with respect to the mounting table by using a detection result.

7. The delivery position aligning method of claim 4, wherein the vacuum processing apparatus further has a dummy storage for disposing dummy substrates thereto, the method further comprising:
   transferring a dummy substrate arranged in the dummy storage to the orienter to detect a position of the substrate; and
   performing position alignment of the atmospheric transfer mechanism with respect to the dummy storage by using a detection result.

8. A delivery position aligning method for use in a vacuum processing apparatus, the method comprising:
   preparing the vacuum processing apparatus which has
      a vacuum transfer chamber,
      a vacuum transfer mechanism, provided in the vacuum transfer chamber, for transferring a substrate in a vacuum atmosphere,
      a plurality of vacuum processing chambers, connected to the vacuum transfer chamber, for performing a vacuum processing on the substrate,
      a load lock chamber connected to the vacuum transfer chamber,
      an atmospheric transfer chamber connected to the load lock chamber,
      an atmospheric transfer mechanism, provided in the atmospheric transfer chamber, for transferring the substrate in an atmospheric atmosphere,
      an orienter for detecting a position of the substrate in the atmospheric atmosphere, and
      a position detecting mechanism, arranged in the vacuum transfer chamber, for detecting a position of the substrate;
   aligning the atmospheric transfer mechanism and the load lock chamber by using the orienter;
   disposing the substrate at a position of the load lock chamber by using the atmospheric transfer mechanism aligned with respect to the load lock chamber by the orienter;
   transferring the substrate disposed at a predetermined position of each of access points of the vacuum transfer mechanism to the position detecting mechanism by the vacuum transfer mechanism to detect a position of the substrate, wherein the access points of the vacuum transfer mechanism include the vacuum processing chambers and the load lock chamber; and
   performing position alignment for each of the access points by using a detection result,
   wherein substrates are disposed in advance at all locations in the vacuum processing apparatus at which the substrates are allowed to be disposed, and the position alignment is performed by transferring the disposed substrates sequentially.

* * * * *